US005565824A

United States Patent [19]
Nagano

[11] Patent Number: 5,565,824
[45] Date of Patent: Oct. 15, 1996

[54] LADDER FILTER HAVING REDUCED SIZE

[75] Inventor: Koichi Nagano, Nagaokakyo, Japan

[73] Assignee: Murata Manufacturing Co., Ltd., Japan

[21] Appl. No.: 394,285

[22] Filed: Feb. 24, 1995

[30] Foreign Application Priority Data

Feb. 25, 1994 [JP] Japan .................................. 6-028314

[51] Int. Cl.$^6$ ...................................................... H03H 9/58
[52] U.S. Cl. ............................................ 333/189; 310/348
[58] Field of Search ...................................... 333/186, 187, 333/188, 189, 190, 191, 192; 310/348, 357

[56] References Cited

U.S. PATENT DOCUMENTS

| | | | |
|---|---|---|---|
| 4,864,259 | 9/1989 | Takamoro et al. | 333/189 |
| 5,260,675 | 11/1993 | Ogawa et al. | 333/189 |
| 5,274,529 | 12/1993 | Mura et al. | 361/679 |

Primary Examiner—Benny Lee
Assistant Examiner—David Vu
Attorney, Agent, or Firm—Ostrolenk, Faber, Gerb & Soffen, LLP

[57] ABSTRACT

A ladder filter includes two piezoelectric resonators which operate in a stretch vibration mode and stacked on top of each other with a grounding terminal located therebetween. Two piezoelectric resonators which operate in a length vibrating mode are provided at both sides of the piezoelectric resonators which operate in a stretch vibration mode.

11 Claims, 3 Drawing Sheets

LADDER FILTER HAVING REDUCED SIZE

BACKGROUND OF THE INVENTION

1. Field of the invention

The present invention relates to a ladder filter, and more particularly to a ladder filter which is preferably used for a transceiver, a cordless telephone and so on.

2. Description of Related Art

Conventionally, a ladder filter, as shown in FIG. 6, which is assembled by stacking a plurality of piezoelectric resonators and terminals and inserting the stack of resonators and terminals into a case is well known. The ladder filter of FIG. 6 is formed by laminating piezoelectric resonators 3, 4, 5 and 6, terminals 11, 12, 13 and 14 and a dummy terminal 15 and inserting the resonators and terminals into a resin case 1 which has an opening at the left side in FIG. 6. The piezoelectric resonators of this filter form an equivalent circuit as shown in FIG. 5. Since FIG. 5 shows a preferred embodiment of the present invention, the reference numerals of the preferred embodiment are indicated.

However, in the conventional ladder filter, both the resonators 3 and 4 connected in series and the resonators 5 and 6 connected in parallel operate in a stretch vibration mode. Thereby, the area and the thickness of each resonator 3, 4, 5 and 6 are to a specified size, and the height of each of the resonators becomes large. In addition, because the resonators 3, 4, 5 and 6 having a relatively large height are stacked vertically, the stack of resonators also has a great height thereby preventing the size of the filter from being reduced.

SUMMARY OF THE INVENTION

To solve the disadvantages of the prior art, the preferred embodiments of the present invention provide a short thin ladder filter having an overall size that is substantially reduced as compared to the prior art.

A a ladder filter according to the preferred embodiments of the present invention comprises a piezoelectric resonator which operates in a stretch vibration mode and a piezoelectric resonator which operates in a length vibration mode. The resonator which operates in the stretch vibration mode requires a specified area, but is relatively thin. On the other hand, the resonator which operates in the length vibration mode requires a specified thickness but requires only a small area. Thus, the resonator which operates in a stretch vibration mode is set in a lateral position, and the resonator which operates in a length vibration mode is provided at a side of the resonator which operates in a stretch vibration mode.

In the above structure, since the number of stacked resonators is decreased, a short thin ladder filter can be obtained.

BRIEF DESCRIPTION OF THE DRAWINGS

This and other objects and features of the preferred embodiments of the present invention will become apparent from the following description with reference to the accompanying drawings, in which.

DETAILED DESCRIPTION OF PREFERRED EMBODIMENTS

Figure 1:
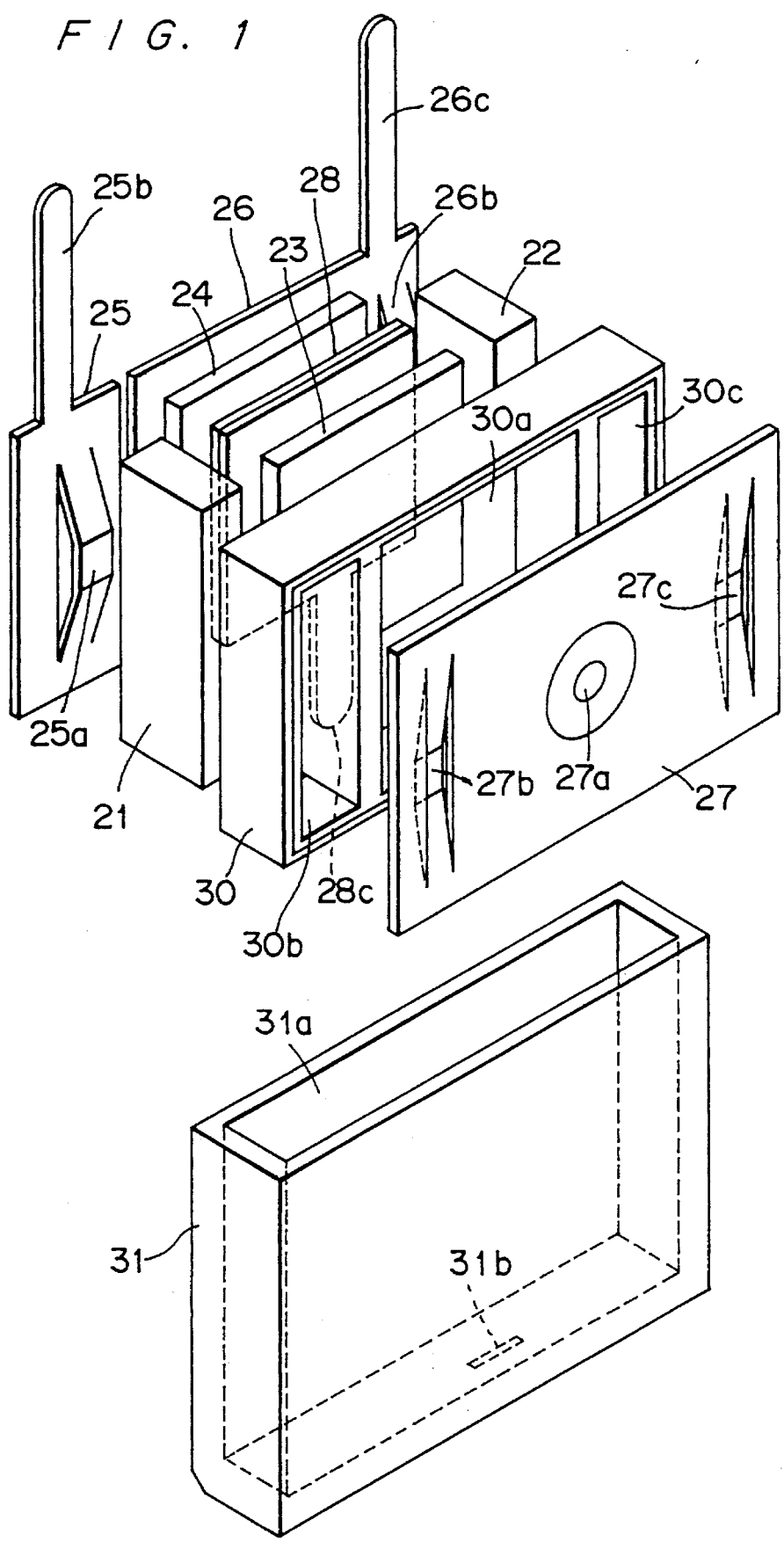
FIG. 1 is an exploded perspective view of a ladder filter which is a preferred embodiment of the present invention.
Figure 2:
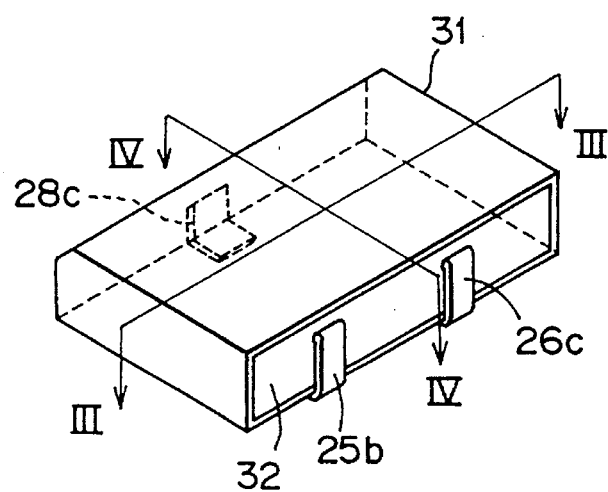
FIG. 2 is a perspective view of the ladder filter which is a finished product.
Figure 3:
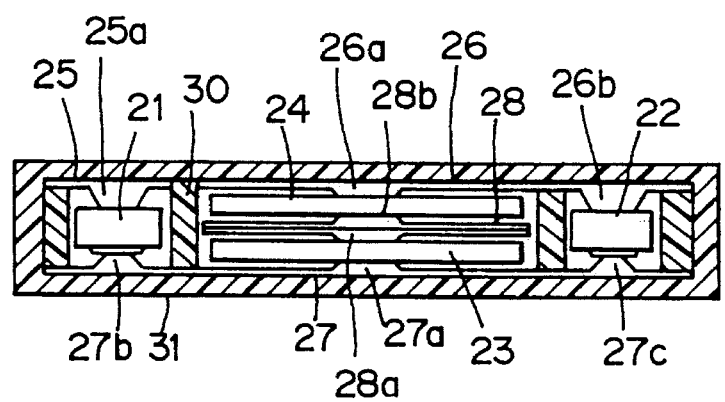
FIG. 3 is a sectional view of the ladder filter, taken along the line III—III, only a case being cut.

The description of preferred embodiments according to the present invention is given below, referring to the accompanying drawings.

In FIGS. 1 through 4, a ladder filter is composed of piezoelectric resonators 21, 22, 23 and 24, an input terminal 25, an output terminal 26, a junction terminal 27, a grounding terminal 28, an inner case 30 and an outer case 31.

Figure 5:
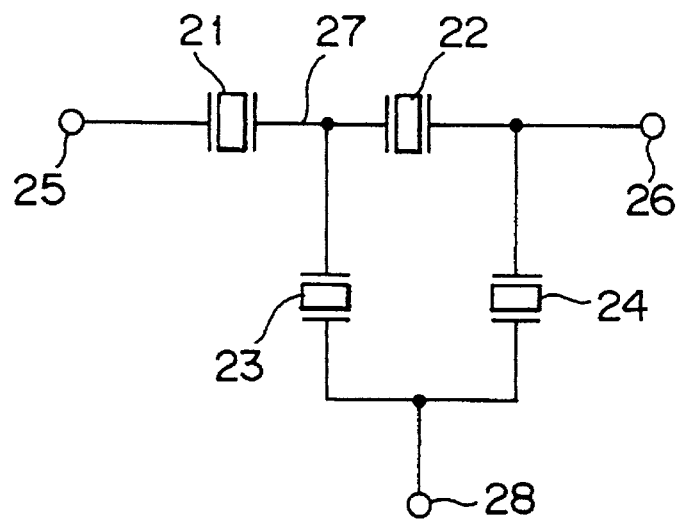
FIG. 5 is an equivalent circuit diagram of the ladder filter.

The piezoelectric resonators 21 and 22 are preferably rectangular parallelepiped. Electrodes preferably made of silver are formed on two opposite sides (upper and bottom sides in FIG. 3) of the piezoelectric resonators 21 and 22. The piezoelectric resonators 21 and 22 operate in a length vibration mode and are connected in series (refer to FIG. 5). The piezoelectric resonators 23 and 24 are preferably plate-shaped. Electrodes preferably made of silver are formed on both sides of the piezoelectric resonators 23 and 24. The piezoelectric resonators 23 and 24 operate in a stretch vibration mode and are connected in parallel.

The input terminal 25 has a contact portion 25a and an outer connecting portion 25b. The output terminal 26 has contact portions 26a and 26b and an outer connecting portion 26c. The junction terminal 27 has a contact portion 27a at the center and contact portions 27b and 27c at both ends. The grounding terminal 28 is formed by folding a plate and has contact portions 28a and 28b and an outer connecting portion 28c.

The inner case 30 is a frame type which has a center opening 30a and side openings 30b and 30c and is preferably integrally molded out of resin. The outer case 31 is preferably integrally molded out of resin into a box and has an opening 31a at a side and a slit 31b at the opposite side.

Next, an assembling method will be explained.

First, the junction terminal 27 is placed on an assembling line (not shown), and the inner case 30 is set thereon. Next, the resonator 23, the grounding terminal 28 and the resonator 24 are stacked in the center opening 30a of the inner case 30, and at the same time, the resonators 21 and 22 are placed in the side openings 30b and 30c. At that time, the outer connecting portion 28c of the grounding terminal 28 is protruded from the slit 30d (refer to FIG. 4) which is made in the inner case 30. Then, the input terminal 25 is set on the resonator 21, and the output terminal 26 is set on the resonators 22 and 24.

Figure 4:
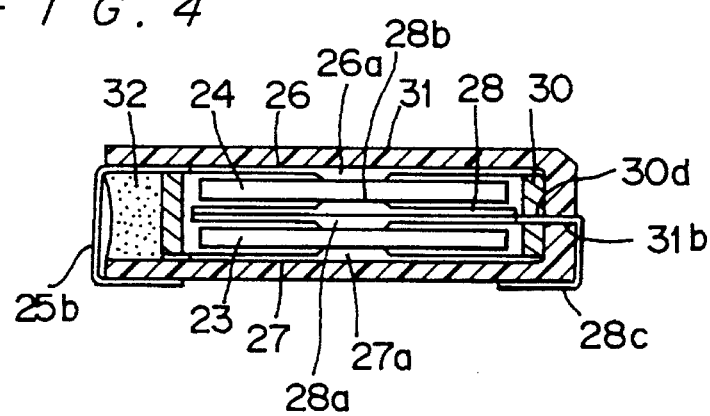
FIG. 4 is a sectional view of the ladder filter, taken along the line IV—IV, only the case and a sealing material being cut.

A unit which is assembled in accordance with the above method is inserted into the outer case 31 from the opening 31a. At that time, the outer connecting portion 28c of the grounding terminal 28 is protruded outward from the slit 31b. Also, the outer connecting portions 25b and 26c of the terminals 25 and 26 are also protruded outward from the opening 31a. Next, as shown in FIG. 4, the opening 31a of the outer case 31 is sealed with a sealing material 32 (e.g. epoxy resin). After hardening of the sealing material 32, the outer connecting portions 25b, 26c and 28c are bent.

Thereby, the surface mounting type ladder filter with three terminals is finished.

Figure 6:
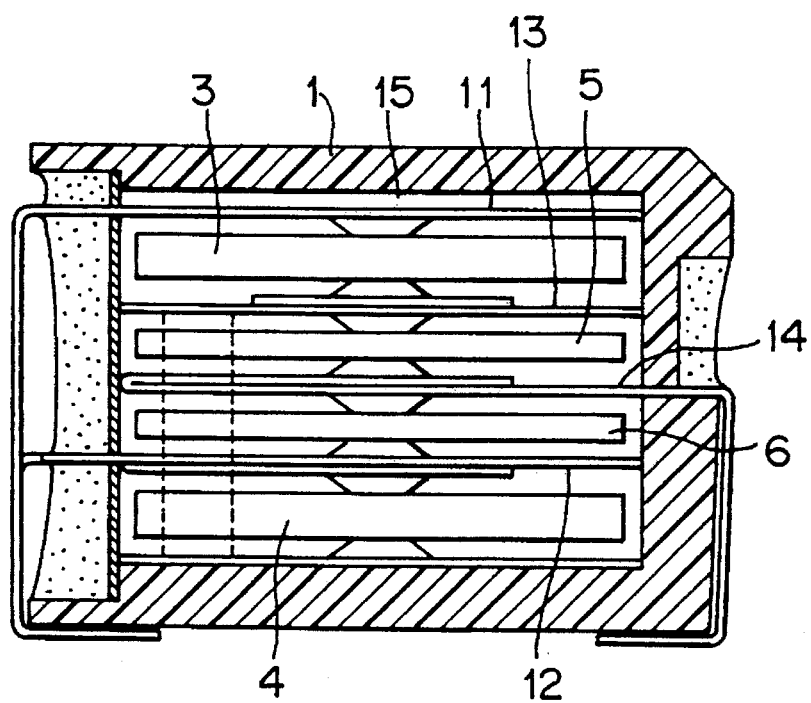
FIG. 6 is a sectional view which shows an inner structure of a conventional ladder filter.

In the present preferred embodiment, only two piezoelectric resonators 23 and 24 which operate in a stretch vibration mode are stacked, and the piezoelectric resonators 21 and 22 which operate in a length vibration mode are provided at the sides of the piezoelectric resonators 23 and 24. Thus, the height of the filter is about a half of the height of the conventional ladder filter of FIG. 6. Furthermore, the resonators 21 and 22 which operate in a length vibration mode do not occupy a large area.

Also, it is possible to use resonators which operate in a stretch vibration mode for series connection and resonators which operate in a length vibration mode for parallel connection.

Although the present invention has been described in connection with the preferred embodiments above, it is to be noted that various changes and modifications are apparent to a person skilled in the art. Such changes and modifications are to be understood as being within the scope of the present invention.

What is claimed is:

1. A ladder filter comprising:
   at least two piezoelectric resonators each including a pair of major surfaces joined by a plurality of edge surfaces and being connected in series to each other;
   at least two piezoelectric resonators each including a pair of major surfaces joined by a plurality of edge surfaces and being connected in parallel to each other; and
   a junction terminal arranged to electrically connect the at least two piezoelectric resonators connected in series and the at least two piezoelectric resonators connected in parallel;
   a case including a central opening and a pair of side openings each disposed on one side of the central openings, the at least two resonators connected in parallel being stacked on each other and being located in said central opening, each of the at least two resonators connected in series being located in a respective one of said pair of side openings, each of said pair of side openings being arranged such that one of the major surfaces of each of the at least two resonators connected in series is arranged to be substantially perpendicular to one of the major surfaces of each of the at least two resonators connected in parallel.

2. A ladder filter as claimed in claim 1, wherein the at least two piezoelectric resonators connected in parallel are arranged and adapted to operate in a stretch vibration mode; and
   the at least two piezoelectric resonators connected in series are arranged and adapted to operate in a length vibration mode.

3. A ladder filter as claimed in claim 1, further comprising an outer housing for containing the case.

4. A ladder filter comprising:
   an outer case made of an insulating material;
   a first and a second piezoelectric resonator connected in series;
   a third and a fourth piezoelectric resonator connected in parallel;
   and an inner case disposed within the outer case, the inner case including a central opening and a pair of side openings each disposed on one side of the central opening, the third and fourth resonators being stacked on each other and located in the central opening, each of the pair of side openings being arranged to house one of the first and second resonators such that the first and second resonators are located at opposite ends of said third and fourth resonators and such that the first and second resonators are not stacked on top of each other.

5. The ladder filter of claim 4, wherein the first and second resonators are arranged and adapted to vibrate in a length vibration mode and the third and fourth resonators are arranged and adapted to vibrate in a stretch vibration mode.

6. The ladder filter of claim 4, further comprising a junction terminal arranged to contact a bottom surface of each of the first, second and third resonators to electrically connect the first, second, third and fourth resonators.

7. A ladder filter comprising:
   a case having a first main surface and a second main surface disposed opposite to each other, a plurality of side surfaces and an opening which is sealed with a sealing material;
   a plate-type input terminal including a base having a contact portion and an external connecting portion extending from the base, the base being provided in the case along the first main surface and the external connecting portion being exposed to the outside of the case;
   a plate-type output terminal including a base having first and second contact portions and an external connecting portion extending from the base, the base being provided in the case along the first main surface adjacent to the input terminal and the external connecting portion being exposed to the outside of the case;
   a plate-type junction terminal having a substantially rectangular, continuously flat shape, the junction terminal having first, second and third contact portions and being arranged in the case so as to extend continuously along the second main surface for an entire length of the junction terminal;
   a plate-type grounding terminal including a base having a first contact portion and a second contact portion and an external connecting portion extending from the base, the base being provided between a level of the input terminal and the output terminal and a level of the junction terminal and the external connecting portion being exposed to the outside of the case;
   a first and a second piezoelectric resonator connected in series, the first piezoelectric resonator being provided between the input terminal and the junction terminal and connected electrically with the contact portion of the input terminal and the first contact portion of the junction terminal, and the second piezoelectric resonator being provided between the output terminal and the junction terminal and connected electrically with the first contact portion of the output terminal and the second contact portion of the junction terminal; and
   a third and a fourth piezoelectric resonator connected in parallel, the third piezoelectric resonator being provided between the output terminal and the grounding terminal and connected electrically with the second contact portion of the output terminal and the first contact portion of the grounding terminal, and the fourth piezoelectric resonator being provided between the grounding terminal and the junction terminal and connected electrically with the second contact portion of the grounding terminal and the third contact portion of the junction terminal.

8. A ladder filter as claimed in claim 7, wherein the first and the second piezoelectric resonators operate in a length vibration mode and the third and fourth piezoelectric resonators operate in a stretch vibration mode.

9. A ladder filter as claimed in claim 7, wherein the first and the second piezoelectric resonators operate in a stretch vibration mode and the third and the fourth piezoelectric resonators operate in a length vibration mode.

10. A ladder filter as claimed in claim 7, wherein each external connecting portion of the input and the output terminals is exposed from the sealing material to the outside of the case and extends along an external surface of the first main surface and the external connecting portion of the grounding terminal is exposed from the side surface of the case which is positioned opposite to the sealing material to the outside of the case and extends along the first main surface.

11. A ladder filter as claimed in claim 7, further comprising an inner case, the inner case including a center opening which contains the third and the fourth piezoelectric resonators and the grounding terminal and a pair of side openings each containing a respective one of the first and the second piezoelectric resonators.

* * * * *